(12) United States Patent
Haessig et al.

(10) Patent No.: US 12,099,074 B2
(45) Date of Patent: Sep. 24, 2024

(54) ELECTRONIC PROOF OF AIR FLOW SWITCH

(71) Applicant: Evolution Controls Inc., Poway, CA (US)

(72) Inventors: David Lee Haessig, Poway, CA (US); Joshua Lee Welton, Poway, CA (US)

(73) Assignee: Evolution Controls Inc., Poway, CA (US)

( * ) Notice: Subject to any disclaimer, the term of this patent is extended or adjusted under 35 U.S.C. 154(b) by 659 days.

(21) Appl. No.: 17/395,310

(22) Filed: Aug. 5, 2021

(65) Prior Publication Data

US 2022/0043021 A1 Feb. 10, 2022

Related U.S. Application Data

(60) Provisional application No. 63/062,089, filed on Aug. 6, 2020.

(51) Int. Cl.
| | | |
|---|---|---|
| *G01P 13/00* | (2006.01) | |
| *F24D 19/10* | (2006.01) | |
| *F24F 11/49* | (2018.01) | |
| *G05B 19/042* | (2006.01) | |
| *H03F 3/45* | (2006.01) | |
| *H03K 5/24* | (2006.01) | |
| *H05K 1/18* | (2006.01) | |

(52) U.S. Cl.
CPC ........ *G01P 13/002* (2013.01); *F24D 19/1084* (2013.01); *F24F 11/49* (2018.01); *G05B 19/042* (2013.01); *H03F 3/45475* (2013.01); *H03K 5/24* (2013.01); *H05K 1/181* (2013.01); *G05B 2219/2614* (2013.01); *H05K 2201/10151* (2013.01)

(58) Field of Classification Search
None
See application file for complete search history.

(56) References Cited

U.S. PATENT DOCUMENTS 4,934,189 A * 6/1990 Tanimoto .............. G01F 1/6986
73/114.34

\* cited by examiner

*Primary Examiner* — Farhana A Hoque
(74) *Attorney, Agent, or Firm* — Jo Carothers; Weintraub Tobin

(57) ABSTRACT

A method and apparatus to electronically sense air flow and close a switch when air flow is adequate to operate an electric heater, HVACR system, or other apparatus. The apparatus is more reliable than electro-mechanical devices often used for this purpose.

20 Claims, 17 Drawing Sheets

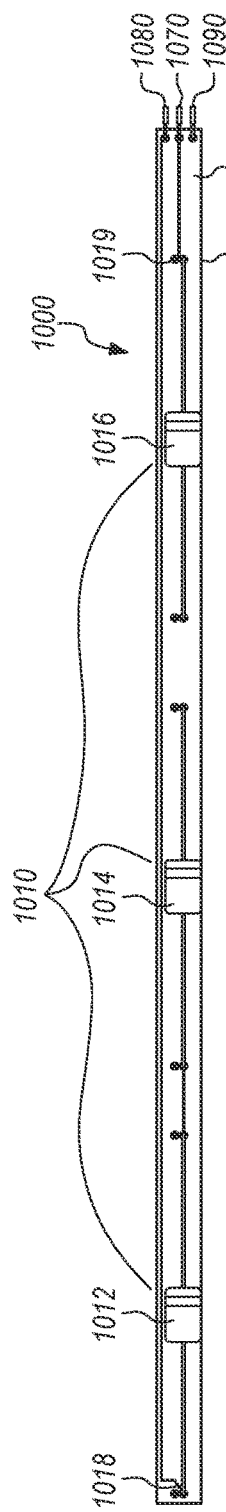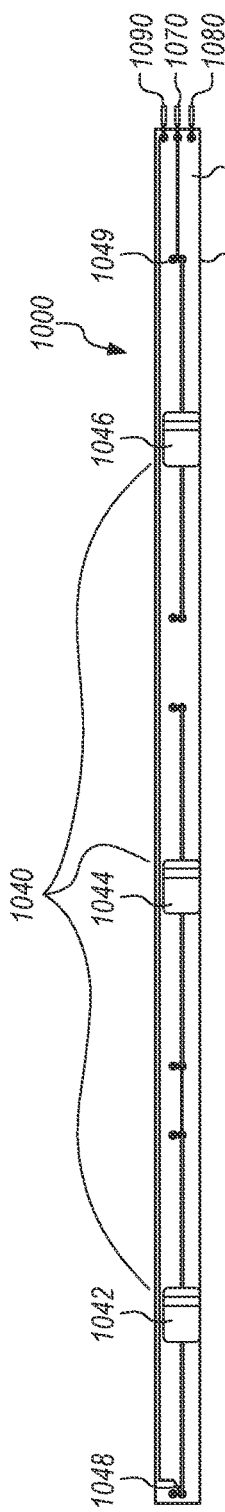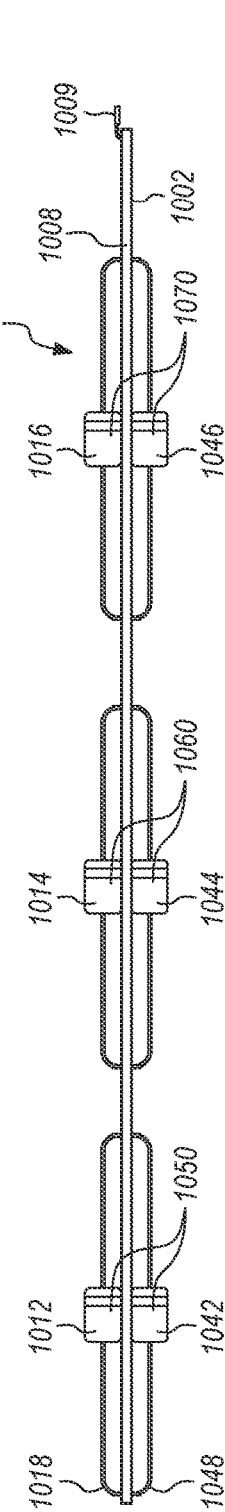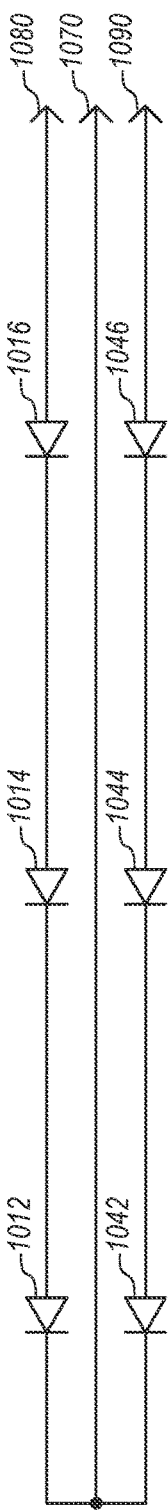

| Callout | Element | Value | JEDEC Part Number |
|---|---|---|---|
| 440 | D1 | 1A, 1kV | IN4007 |
| 442 | D2 | 4.7V | IN5230B |
| 444 | D3 | 300mA, 100V | IN4148 |
| 446 | D4 | 300mA, 100V | IN4148 |
| 460 | Switch | 8A, 200V | BTA08 |
| 402 | R1 | 2K00 | |
| 404 | R2 | 680R | |
| 406 | R3 | 10K0 | |
| 408 | R4 | 10K0 | |
| 410 | R5 | 1K00 | |
| 412 | R6 | 1K00 | |
| 414 | R7 | 10K0 | |
| 416 | R8 | 10K0 | |
| 418 | R9 | 1K00 | |
| 420 | R10 | 10K0 | |
| 422 | R11 | 200R | |
| 424 | R12 | 10K0 | |
| 426 | Potentiometer | 10K0 | |
| 454 | | Operational Amplifier | LM358LV |
| 452 | | Operational Amplifier | LM358LV |
| 480 | | Microcontroller | PIC12F675 |

*FIG. 13*

| Callout | Element | Value | JEDEC Part Number |
|---|---|---|---|
| 440 | D1 | 1A, 1kV | IN4007 |
| 442 | D2 | 4.7V | IN5230B |
| 444 | D3 | 300mA, 100V | IN4148 |
| 446 | D4 | 300mA, 100V | IN4148 |
| 502 | J4 | 100 mil Header Jumper | |
| 504 | J4a | 1x2 100 mil Header | |
| 506 | J4b | 1x2 100 mil Header | |
| 460 | Switch | 8A, 200V | BTA08 |
| 402 | R1 | 2K00 | |
| 404 | R2 | 680R | |
| 406 | R3 | 10K0 | |
| 408 | R4 | 10K0 | |
| 410 | R5 | 1K00 | |
| 412 | R6 | 1K00 | |
| 414 | R7 | 10K0 | |
| 416 | R8 | 10K0 | |
| 418 | R9 | 1K00 | |
| 420 | R10 | 10K0 | |
| 422 | R11 | 200R | |
| 424 | R12 | 10K0 | |
| 508 | R13 | 10K0 | |
| 454 | | Operational Amplifier | LM358LV |
| 452 | | Operational Amplifier | LM358LV |
| 480 | | Microcontroller | PIC12F675 |

*FIG. 14*

| Callout | Element | Value | JEDEC Part Number |
|---|---|---|---|
| 604 | C1 | 100 mFd, 10Vdc | |
| 440 | D1 | 1A, 1kV | IN4007 |
| 442 | D2 | 4.7V | IN5230B |
| 444 | D3 | 300mA, 100V | IN4148 |
| 446 | D4 | 300mA, 100V | IN4148 |
| 460 | Switch | 8A, 200V | BTA08 |
| 402 | R1 | 2K00 | |
| 404 | R2 | 680R | |
| 406 | R3 | 10K0 | |
| 408 | R4 | 10K0 | |
| 410 | R5 | 1K00 | |
| 412 | R6 | 1K00 | |
| 414 | R7 | 10K0 | |
| 416 | R8 | 10K0 | |
| 418 | R9 | 10K0 | |
| 420 | R10 | 10K0 | |
| 606 | Potentiometer | 10K0 | |
| 450 | | Operational Amplifier | LM358LV |
| 652 | | Operational Amplifier | LM358LV |
| 602 | U3 | Sample / Hold | DG417 |

*FIG. 15*

| Callout | Element | Value | JEDEC Part Number |
|---|---|---|---|
| 440 | D1 | 1A, 1kV | IN4007 |
| 442 | D2 | 4.7V | IN5230B |
| 444 | D3 | 300mA, 100V | IN4148 |
| 446 | D4 | 300mA, 100V | IN4148 |
| 460 | Switch | 8A, 200V | BTA08 |
| 402 | R1 | 2K00 | |
| 404 | R2 | 680R | |
| 406 | R3 | 10K0 | |
| 408 | R4 | 10K0 | |
| 410 | R5 | 1K00 | |
| 412 | R6 | 1K00 | |
| 414 | R7 | 10K0 | |
| 416 | R8 | 10K0 | |
| 418 | R9 | 1K00 | |
| 420 | R10 | 10K0 | |
| 422 | R11 | 200R | |
| 424 | R12 | 10K0 | |
| 426 | Potentiometer | 10K0 | |
| 702 | R14 | 4K80 | |
| 704 | R15 | 10K0 | |
| 706 | R16 | 1K00 | |
| 708 | R17 | 10K0 | |
| 710 | R18 | 10K0 | |
| 712 | R19 | 2K00 | |
| 716 | R21 | 2K00 | |
| 450 | | Operational Amplifier | LM358LV |
| 452 | | Operational Amplifier | LM358LV |
| 480 | | Microcontroller | PIC12F675 |
| 720 | | Operational Amplifier | LM358LV |
| 722 | | Operational Amplifier | LM358LV |

*FIG. 16*

| Callout | Element | Value | JEDEC Part Number |
|---|---|---|---|
| 804 | C1 | 100mFd, 10Vdc | |
| 440 | D1 | 1A, 1kV | IN4007 |
| 442 | D2 | 4.7V | IN5230B |
| 444 | D3 | 300mA, 100V | IN4148 |
| 446 | D4 | 300mA, 100V | IN4148 |
| 460 | Q1 | 8A, 200V | BTA08 |
| 402 | R1 | 2K00 | |
| 404 | R2 | 680R | |
| 406 | R3 | 10K0 | |
| 408 | R4 | 10K0 | |
| 410 | R5 | 1K00 | |
| 412 | R6 | 1K00 | |
| 414 | R7 | 10K0 | |
| 416 | R8 | 10K0 | |
| 418 | R9 | 1K00 | |
| 420 | R10 | 10K0 | |
| 422 | R11 | 200R | |
| 424 | R12 | 10K0 | |
| 802 | R13 | 10K0 | |
| 806 | R14 | 10K0 | |
| 812 | R15 | 200R | |
| 808 | R16 | 10K0 | |
| 810 | R17 | 1K00 | |
| 450 | | Operational Amplifier | LM358LV |
| 452 | | Operational Amplifier | LM358LV |
| 480 | | Microcontroller | PIC12F675 |
| 820 | U5.1 | Operational Amplifier | LM358LV |

*FIG. 17*

ELECTRONIC PROOF OF AIR FLOW SWITCH

CROSS-REFERENCE TO RELATED APPLICATIONS

This application claims priority under 35 U.S.C. Section 119(e) to U.S. Provisional Patent Application No. 63/062,089, filed on Aug. 6, 2020, the entire disclosure of which is incorporated herein by reference.

FIELD OF THE INVENTION

The present invention relates generally to controls for forced air electric heaters and other components in heating, ventilating, air-conditioning and/or refrigeration (HVACR) systems.

BACKGROUND OF THE INVENTION

Forced air electric heaters in HVACR systems are equipped with thermally activated switches to monitor the temperature of a forced air electric heater's heating element in the forced air electric heater and turn off the heating element when the temperature is above a safe limit. These thermally activated switches have a limited cycle life, so another device can be used to reduce the frequency of cycling of the thermally activated switches.

Because the most common cause of the temperature of a forced air electric heater's heating element rising above a desired temperature limit is insufficient air flow, an air flow sensing device is often connected to the heating element to turn off the forced air electric heater's heating element when air flow is insufficient.

These air flow sensing devices are most often a mechanical switch connected to a hinged sail (sail switch), or enclosed diaphragm arranged to sense air flow velocity, pressure, or differential pressure between a fan inlet and fan outlet. Other solutions mount a temperature sensor close to the forced air electric heater heating's element to sense a high temperature when air flow is not sufficient.

However, these electro-mechanical switch solutions are difficult to adjust and require periodic readjustment. And, the temperature sensing solutions are not as reliable as direct air flow sensing. Therefore, an improved apparatus and method to determine air flow is desired to overcome these current limitations and difficulties.

BRIEF SUMMARY OF THE INVENTION

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

According to various embodiments, the present invention uses a pair of small signal diodes, a first sensing diode and a second sensing diode, to sense air flow as part of an electronic proof of air flow switch ("EPAFS") and method for same. Both diodes are exposed to the air flow in a HVACR system. The disclosed invention provides a novel and unique apparatus and method to periodically heat a first sensing diode, turn off the heat source to the first sensing diode, and then compare the temperature difference between the heated first sensing diode and the unheated second sensing diode.

In one embodiment, the first sensing diode is heated using pulsating direct current derived from the alternating current (AC) power line as a source of heating pulses. The design is unique in the use of a self-heating sensing element and the use of pulsating direct current derived from the AC voltage as a source of heating pulses. Using the half-rectified AC to pulse heat the first sensing diode eliminates the need to generate the heating pulses by using a microcontroller and other active components therefore getting all the benefits of using less components.

A microcontroller monitors the pulsating direct current, then senses and calculates the temperature difference between the first sensing diode and the second sensing diode when the heating pulse is not present. The temperature difference between the first sensing diode and the second sensing diode represents the sensed air flow. The temperature difference is compared to a reference value set by an adjuster, such as a potentiometer or a jumper. If the air flow is greater than the reference value, a Triac or other suitable switch is turned on to enable the forced air electric heater control circuitry.

In another embodiment, the microcontroller functions are replaced by analog electronic circuitry. An analog sample hold circuit monitors the pulsating direct current, then samples the temperature difference between the first sensing diode and the second sensing diode when the heating pulse is not present and holds the temperature difference between the first sensing diode and the second sensing diode when the heating pulse is present. An analog comparator compares the temperature difference to a reference value set by an adjuster, such as a potentiometer. If the air flow is greater than the reference value, a Triac or other suitable switch is turned on to enable the forced air electric heater control circuitry.

In another embodiment, the second sensing diode, which is not heated, is also used to sense the air flow temperature. A circuit is added to amplify the signal from the second sensing diode. The amplified signal is connected to the microcontroller as a temperature indication. As an additional safety measure, the switch is turned off when the temperature of the second sensing diode is too high for safe operation of the heater.

In another embodiment, the microcontroller or analog circuitry outputs the difference of the junction voltage of the diodes to indicate air flow velocity, then outputs the signal as an analog signal indicating air flow velocity.

In another embodiment, multiple pairs of sensing diodes are used. For example, a three-point sensing probe has three unheated diodes wired in series and three heated diodes wired in series. The diode pairs may be placed at different points in the air flow to sense the average air flow.

In another embodiment, an electrical jumper is used to adjust the EPAFS. In this configuration, the jumper is put in place and the forced air electric heater is set to the minimum safe air flow. The jumper is removed, causing the microcontroller in the EPAFS to store the sensed air flow as the minimum air flow allowed to enable the heater's heating element.

In another embodiment, the EPAFS is used to monitor air flow through an air conditioner or refrigeration evaporator. Refrigeration evaporators may be used in applications where ice accumulates on the air side of the evaporator. Accumulated ice blocks air flow, preventing proper operation of the evaporator. Equipment with evaporators, such as refrigeration systems, where frost can occur are often fitted with a mechanism to defrost the evaporator. The defrost cycle is often initiated by a timer, regardless of frost build up, resulting in energy waste. A better solution is to sense air flow using EPAFS and a diode probe such as single point remote air flow sensor or a multi-point remote air flow sensor. The EPAFS may be installed in the evaporator air flow to sense low air flow, indicating an ice buildup. When low evaporator air flow is detected, the EPAFS signals the air conditioning or refrigeration equipment to start a defrost cycle.

In a further embodiment, the EPAFS is mounted to the inlet cone of a fan to determine whether there is sufficient air flow through the fan.

Accordingly, one or more embodiments of the present invention overcomes one or more of the shortcomings of the known prior art.

For example, in one embodiment, an EPAFS and probe apparatus for use in an HVACR system comprises a diode probe comprising a first sensing diode with a first junction voltage, and a second sensing diode with a second junction voltage; a half wave rectifier, wherein the half wave rectifier provides a heating pulse to heat the first sensing diode during a heating period and no heating pulse during a measuring period; a differential amplifier, wherein the differential amplifier measures a difference between the first junction voltage of the first sensing diode and the second junction voltage of the second sensing diode during the measuring period, and outputs a first output signal based on the difference between the first junction voltage and the second junction voltage; an inverter-amplifier circuit, wherein the inverter-amplifier circuit amplifies the first output signal from the differential amplifier and outputs a second output signal; a microcontroller, wherein the microcontroller compares the second output signal from the inverter-amplifier circuit to a threshold value; a switch for connecting to a forced air electric heating apparatus; and wherein the microcontroller is connected to the switch, and wherein the microcontroller turns off the switch when the second output signal exceeds the threshold value.

In this embodiment, the EPAFS and probe apparatus can further comprise a potentiometer for setting the threshold; wherein the switch is a solid-state switch; wherein the half wave rectifier comprises a diode; wherein the microcontroller further comprises an analog-to-digital converter; a pull up resistor, a jumper, and wherein the pull up resistor and jumper set the threshold; the second sensing diode further comprising an anode, a two-stage amplifier having an input connected to the anode of the second sensing diode and an output connected to the microcontroller, wherein the output of the two-stage amplifier is an amplified signal indicative of air temperature, and wherein the microcontroller turns off the switch when the output of the two-stage amplifier is above a temperature threshold value; an integrator connected to an output of the microcontroller, an amplifier connected to the output of the integrator, and wherein the output of the amplifier is indicative of air flow velocity; and a printed circuit board, a first conductor, a second conductor, a third conductor, the first sensing diode mounted the printed circuit board, the first sensing diode comprising a first cathode connected to the first conductor and a first anode connected to the second conductor, and the second sensing diode mounted on the printed circuit board, the second sensing diode comprising a second cathode connected to the first conductor and a second anode connected to the third conductor.

In another example embodiment, an EPAFS and probe apparatus for use in an HVACR system comprises a diode probe comprising a first sensing diode with a first junction voltage and a second sensing diode with a second junction voltage; a half wave rectifier, wherein the half wave rectifier provides a heating pulse to heat the first sensing diode during a heating period and no heating pulse during a measuring period; a differential amplifier, wherein the differential amplifier measures a difference between the first junction voltage of the first sensing diode and the second junction voltage of the second sensing diode during the measuring period, and outputs a signal based on the difference between the first junction voltage and the second junction voltage; a sample and hold circuit, wherein the sample and hold circuit monitors the heating period and the measuring period to capture the signal during the measuring period and outputs a captured signal; a comparator, wherein the comparator compares the captured signal from the sample and hold circuit to a threshold value; a switch for connecting to a forced air electric heating apparatus; and wherein the comparator is connected to the switch, and wherein the comparator turns off the switch when the captured signal from the sample and hold circuit exceeds the threshold value. In this embodiment, the EPAFS and probe apparatus can further comprise a potentiometer for setting the threshold.

In another example embodiment, an EPAFS and probe apparatus for use in an HVACR system comprises a diode probe comprising a first sensing diode string with a first series junction voltage comprising a plurality of first sensing diodes and wherein the plurality of first sensing diodes are connected in series, second sensing diode string with a second series junction voltage comprising a plurality of second sensing diodes and wherein the plurality of second sensing diodes are connected in series, and wherein each one of the plurality of first sensing diodes forms a sensing diode pair with one of the plurality of second sensing diodes to form a plurality of sensing diode pairs, and wherein the plurality of sensing diode pairs sense the average air flow; a half wave rectifier, wherein the half wave rectifier provides a heating pulse to heat the first sensing diode string during a heating period and no heating pulse during a measuring period; a differential amplifier, wherein the differential amplifier measures a difference between the first series junction voltage of the first sensing diode string and the second series junction voltage of the second sensing diode string during the measuring period, and outputs a first output signal based on the difference between the first series junction voltage and the second series junction voltage; an inverter-amplifier circuit, wherein the inverter-amplifier circuit amplifies the first output signal from the differential amplifier and outputs a second output signal; a microcontroller, wherein the microcontroller compares the second output signal from the inverter-amplifier circuit to a threshold value; a switch for connecting to a forced air electric heating apparatus; and wherein the microcontroller is connected to the switch, and wherein the microcontroller turns off the switch when the second output signal exceeds the threshold value.

In this embodiment, the EPAFS and probe apparatus can further comprises a potentiometer for setting the threshold; a pull up resistor, a jumper; and wherein the pull up resistor and jumper set the threshold; an integrator connected to an output of the microcontroller, an amplifier connected to the output of the integrator, and wherein the output of the amplifier is indicative of air flow velocity; and wherein the microcontroller further comprises an analog-to-digital converter.

In another example embodiment, an EPAFS and probe apparatus for use in an HVACR system comprises a diode probe comprising a first sensing diode string with a first series junction voltage comprising a plurality of first sensing diodes and wherein the plurality of first sensing diodes are connected in series, a second sensing diode string with a second series junction voltage comprising a plurality of second sensing diodes and wherein the plurality of second sensing diodes are connected in series, and wherein each one of the plurality of first sensing diodes forms a sensing diode pair with one of the plurality of second sensing diodes to form a plurality of sensing diode pairs, and wherein the plurality of sensing diode pairs sense the average air flow; a half wave rectifier, wherein the half wave rectifier provides a heating pulse to heat the first sensing diode string during a heating period and no heating pulse during a measuring period; a differential amplifier, wherein the differential amplifier measures a difference between the first series junction voltage of the first sensing diode string and the second series junction voltage of the second sensing diode string during the measuring period, and outputs a first output signal based on the difference between the first series junction voltage and the second series junction voltage; a sample and hold circuit, wherein the sample and hold circuit monitors the heating period and the measuring period to capture the signal during the measuring period and outputs a captured signal; a comparator, wherein the comparator compares the captured signal from the sample and hold circuit to a threshold value; a switch for connecting to a forced air electric heating apparatus; and wherein the comparator is connected to the switch, and wherein the comparator turns off the switch when the second output signal exceeds the threshold value. In this embodiment, the EPAFS and probe apparatus can further comprise a potentiometer for setting the threshold.

In another example embodiment, a remote air flow sensor for a fan inlet cone comprises a printed circuit board, the printed circuit board comprising a top side, a bottom side, a first conductor, a second conductor, and a third conductor; a first sensing diode mounted to the bottom side of the printed circuit board, the first sensing diode comprising a first cathode connected to the first conductor and a first anode connected to the second conductor, a second sensing diode mounted on the bottom side of the printed circuit board, the second sensing diode comprising a second cathode connected to the first conductor and a second anode connected to the third conductor; a plurality of standoffs for mounting the printed circuit board to a fan inlet cone for allowing air flow between the bottom side of the printed circuit board and the fan inlet cone; and wherein the first sensing diode and second sensing diode measure air flow between the bottom side of the printed circuit board and the fan inlet cone.

In another example embodiment, an EPAFS and probe apparatus for use in an HVACR system comprises a diode probe comprising a first sensing diode with a first junction voltage, a second sensing diode with a second junction voltage, and wherein the diode probe measures air flow leaving a refrigeration evaporator; a half wave rectifier, wherein the half wave rectifier provides a heating pulse to heat the first sensing diode during a heating period and no heating pulse during a measuring period; a differential amplifier, wherein the differential amplifier measures a difference between the first junction voltage of the first sensing diode and the second junction voltage of the second sensing diode during the measuring period, and outputs a first output signal based on the difference between the first junction voltage and the second junction voltage; an inverter-amplifier circuit, wherein the inverter-amplifier circuit amplifies the first output signal from the differential amplifier and outputs a second output signal; a microcontroller, wherein the microcontroller compares the second output signal from the inverter-amplifier circuit to a threshold value; a switch for connecting to a refrigeration equipment for controlling a defroster; and wherein the microcontroller is connected to the switch, and wherein the microcontroller turns off the switch when the second output signal exceeds the threshold value.

Other objects, features, and advantages of the present invention will become apparent upon consideration of the following detailed description and the accompanying drawings.

BRIEF DESCRIPTION OF THE DRAWINGS

FIGS. 10A-D shows an example embodiment of a circuit for an EPAFS multiple-point remote air flow probe.

FIG. 13 shows example values and example parts for one embodiment of a circuit for an EPAFS air flow sensor with a microcontroller and a potentiometer adjustment shown in FIG. 4.

FIG. 14 shows example values and example parts for one embodiment of a circuit for an EPAFS air flow sensor with a microcontroller and a jumper shown in FIG. 5.

FIG. 15 shows example values and example parts for one embodiment of an analog circuit for an analog EPAFS with a sample hold circuit and potentiometer adjustment shown in FIG. 6.

FIG. 16 shows example values and example parts for one embodiment of an EPFAS with high temperature cutout circuitry shown in FIG. 7.

FIG. 17 shows example values and example parts for one embodiment of a thermal anemometer circuit for use as an EPFAS shown in FIG. 8.

DETAILED DESCRIPTION OF THE INVENTION

The following is a detailed description of embodiments to illustrate the principles of the invention. The embodiments are provided to illustrate aspects of the invention, but the invention is not limited to any embodiment. The scope of the invention encompasses numerous alternatives, modifications, and equivalents. The scope of the invention is limited only by the claims.

While numerous specific details are set forth in the following description to provide a thorough understanding of the invention, the invention may be practiced according to the claims without some or all of these specific details.

Various embodiments will be described in detail with reference to the accompanying drawings. Wherever possible, the same reference numbers are used throughout the drawings to refer to the same or like parts. References made to particular examples and implementations are for illustrative purposes and are not intended to limit the scope of the claims.

Electronic Proof of Air Flow Switch

Figure 1:
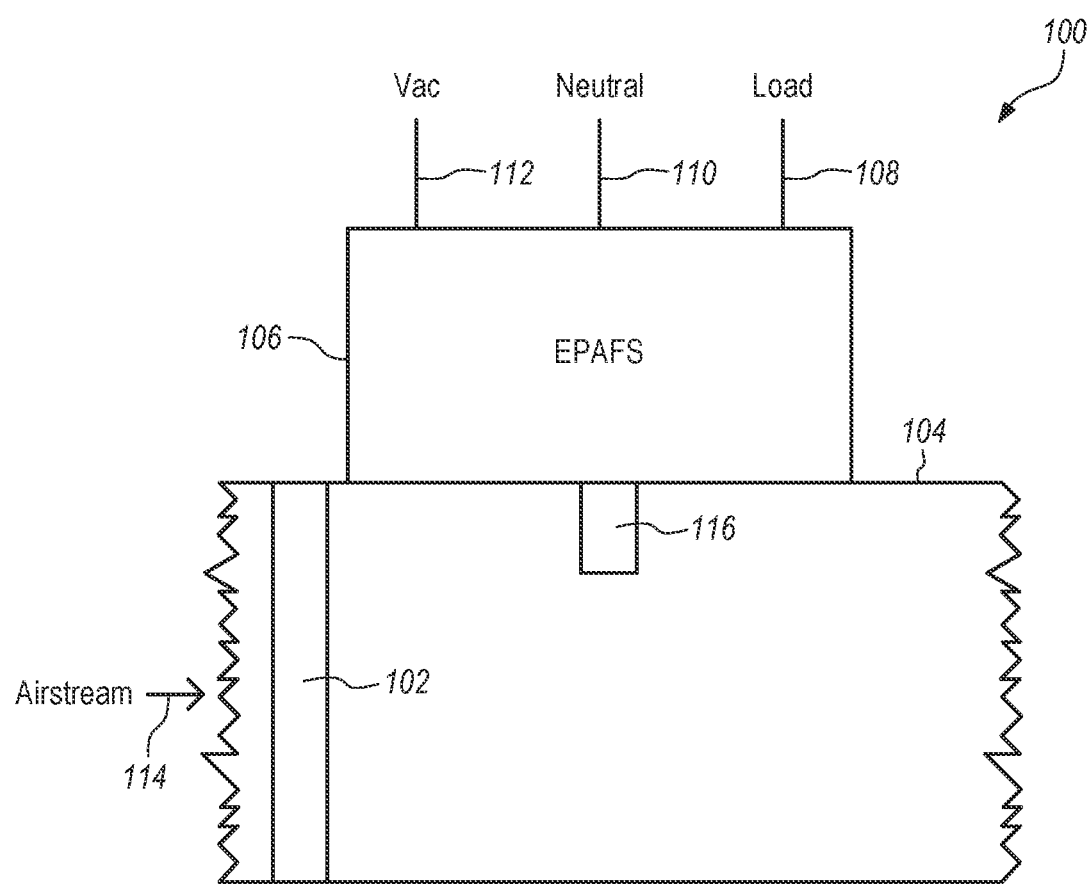
FIG. 1 illustrates an example embodiment of an EPAFS mounted on a forced air electric heater.

FIG. 1 shows an example embodiment of Electronic Proof Of Air Flow Switch (EPAFS) 106 mounted outside a heater duct 104 of a forced air electric heater 100 with electric heating element 102. The electric heating element 102 is mounted in the airstream 114. In one embodiment, HVACR equipment may be fitted with a plurality of electric heating elements 102 to accommodate heating capacity, heater staging, and electrical load balancing requirements. The electric heating element 102 needs air flow to protect it from overheating.

A diode probe 116 with a first sensing diode 444, which is a first sensing diode heated by heating pulses 200, and a second sensing diode 446, which is a reference sensing diode that is not heated, (FIGS. 2 and 4) extends through the heater duct 104 to sense air flow in airstream 114. Diode probe 116 may be part of the EPAFS or a separate assembly connected by a cable, such as a three-conductor cable. Three electrical connections, AC voltage (Vac) 112, a neutral, or common, 110 and load 108 provide control circuit connections 300 (FIG. 3) to existing control circuitry within forced air electric heater 100. In an example embodiment, the AC voltage 112 is 24 Volts AC.

The neutral 110 connection is the common connection for heater control circuitry 300 (FIG. 3) within the forced air electric heating apparatus. AC voltage 112 takes power from heater control circuitry's AC power 303 via transformer 306 (FIG. 3) to power EPAFS 106. Within EPAFS 106, a switch 460 (FIG. 4) connects load 108 to neutral 110 when air flow is suitable for electric heating element 102 operation. Load 108 is connected to a relay 301 (FIG. 3) within the forced air electric heating apparatus or other to heater control circuitry in place of and/or in series with relay 301.

Figure 2:
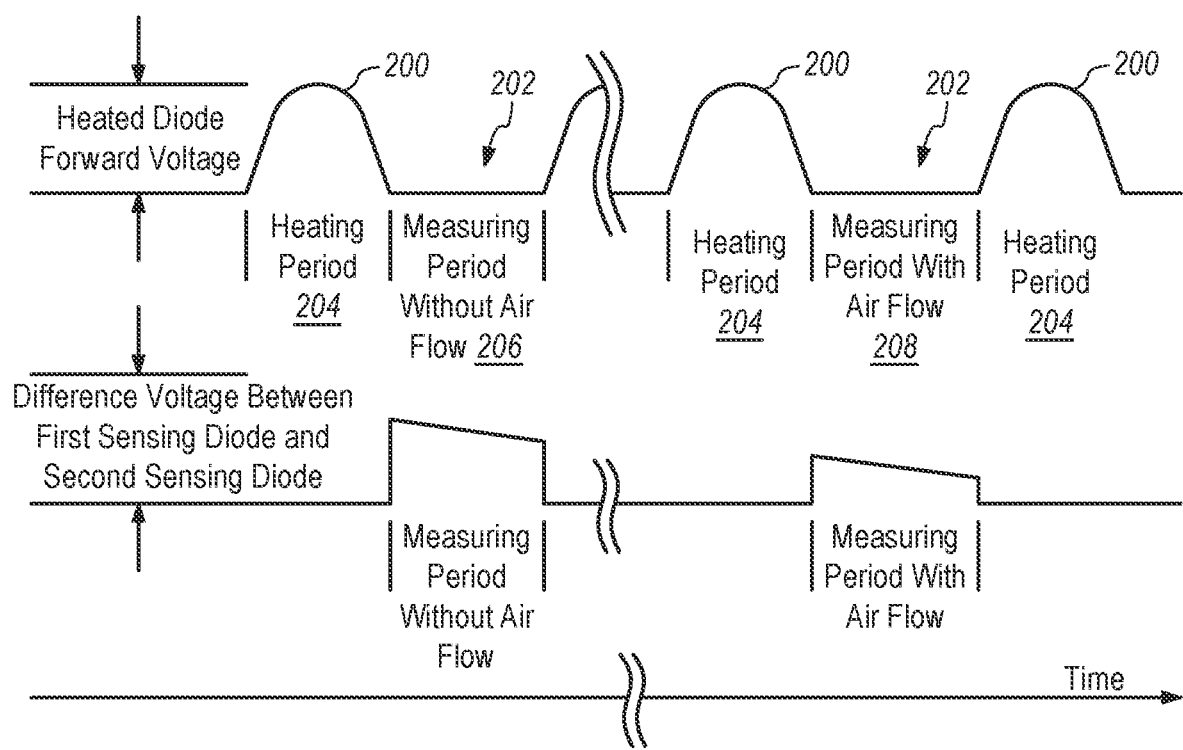
FIG. 2 illustrates an example embodiment of heating pulses and the timing for temperature difference measurements.

The diode probe 116 with first sensing diode 444 and second sensing diode 446 (FIG. 4) is positioned in the airstream 114. In one example embodiment, first sensing diode 444 is heated by periodically passing a heating current 441 (FIG. 4) through first sensing diode 444 during heating period 204 (FIG. 2). After heating periods 204 end and the heating current is off, the temperature of first sensing diode 444 and the temperature of second sensing diode 446 is measured during measuring periods 202 (FIG. 2) by measuring the junction voltage of the first sensing diode 444 and the second sensing diode 446, respectively.

The temperature difference between first sensing diode 444 and second sensing diode 446 during the measuring periods 202 when the heating current is off is used to determine the air flow through heater duct 104. The level of air flow is low or nonexistent when the difference in the temperature of first sensing diodes 444 and the temperature of second sensing diode 446 is high. The level of air flow is adequate when the difference in the temperature of first sensing diode 444 and the temperature of second sensing diode 446 is low.

Figure 4:
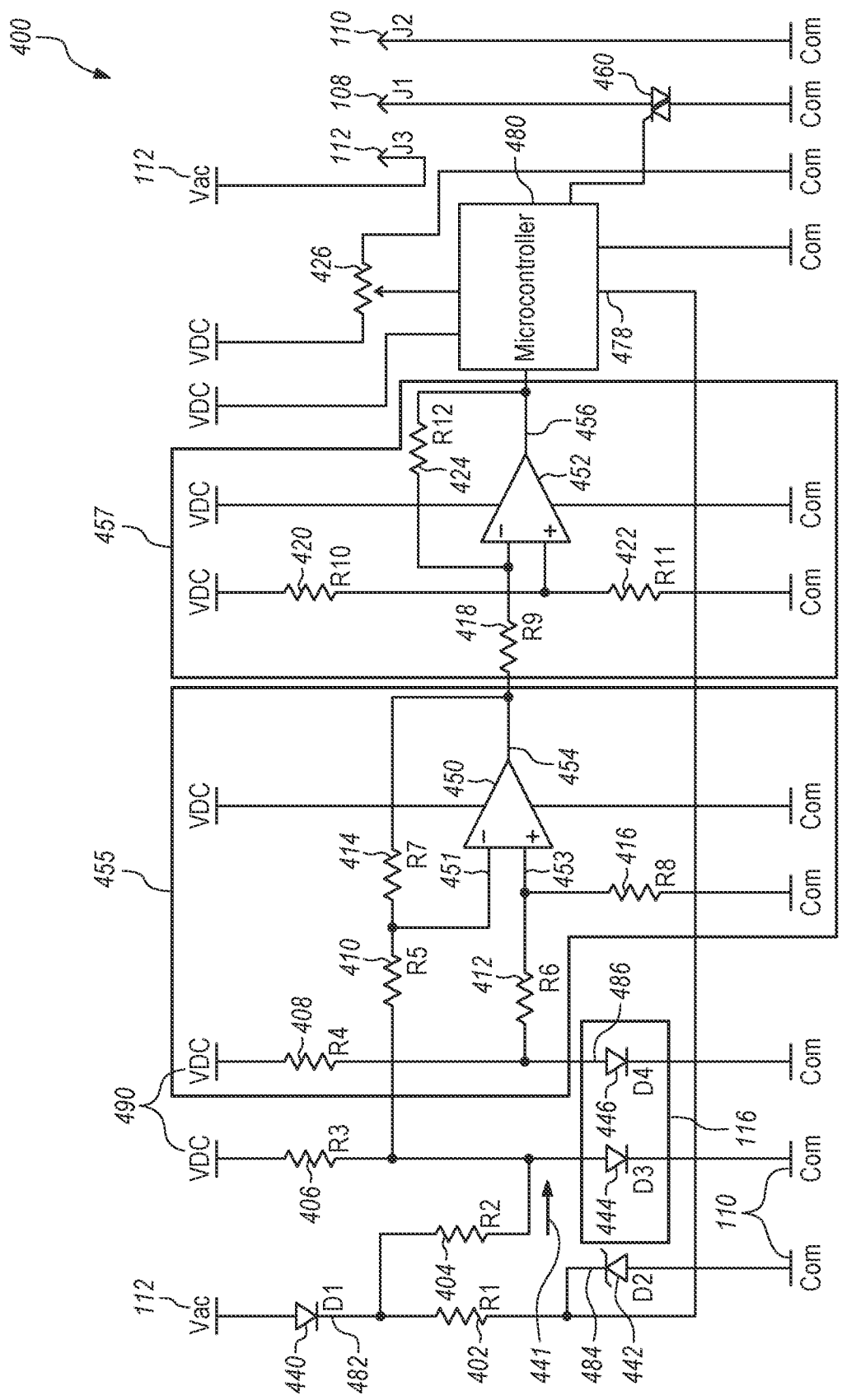
FIG. 4 shows an example embodiment of a circuit for an EPAFS air flow sensor with a microcontroller and a potentiometer adjustment.

FIG. 2 shows a timeline of heating periods 204 with heating pulses 200 and measuring periods 202. FIG. 2 also illustrates the difference voltage between the junction voltage of the first sensing diode 444 and junction voltage of the second sensing diode 446 under different conditions. Half wave rectified AC current from half wave rectifier 440 (FIG. 4), which is limited by resistor 404, provides heating current 441 for heating pulses 200. Heating occurs during heating periods 204 by heating pulses 200 when the half wave rectifier 440 conducts causing heating current 441 to flow through first sensing diode 444 (FIG. 4).

The voltage difference between the junction voltage of the first sensing diode 444 and the junction voltage of the second sensing diode 446 is measured during measuring periods 202 when no heating current is flowing through the half wave rectifier 440. The voltage difference, which represents temperature, is amplified by 457 and fed into microcontroller 480 (FIG. 4). With no air flow or insufficient air flow, the temperature difference is high, as shown in insufficient airflow measuring period 206, because air flow is not moving the heat away from the first sensing diode 444, which was heated during a heating period 204. When there is sufficient air flow, the temperature difference is lower, such as during sufficient air flow measuring period 208 because air flow is moving heat away from the heated first sensing diode 444, which was heated during heating period 204.

Figure 3:
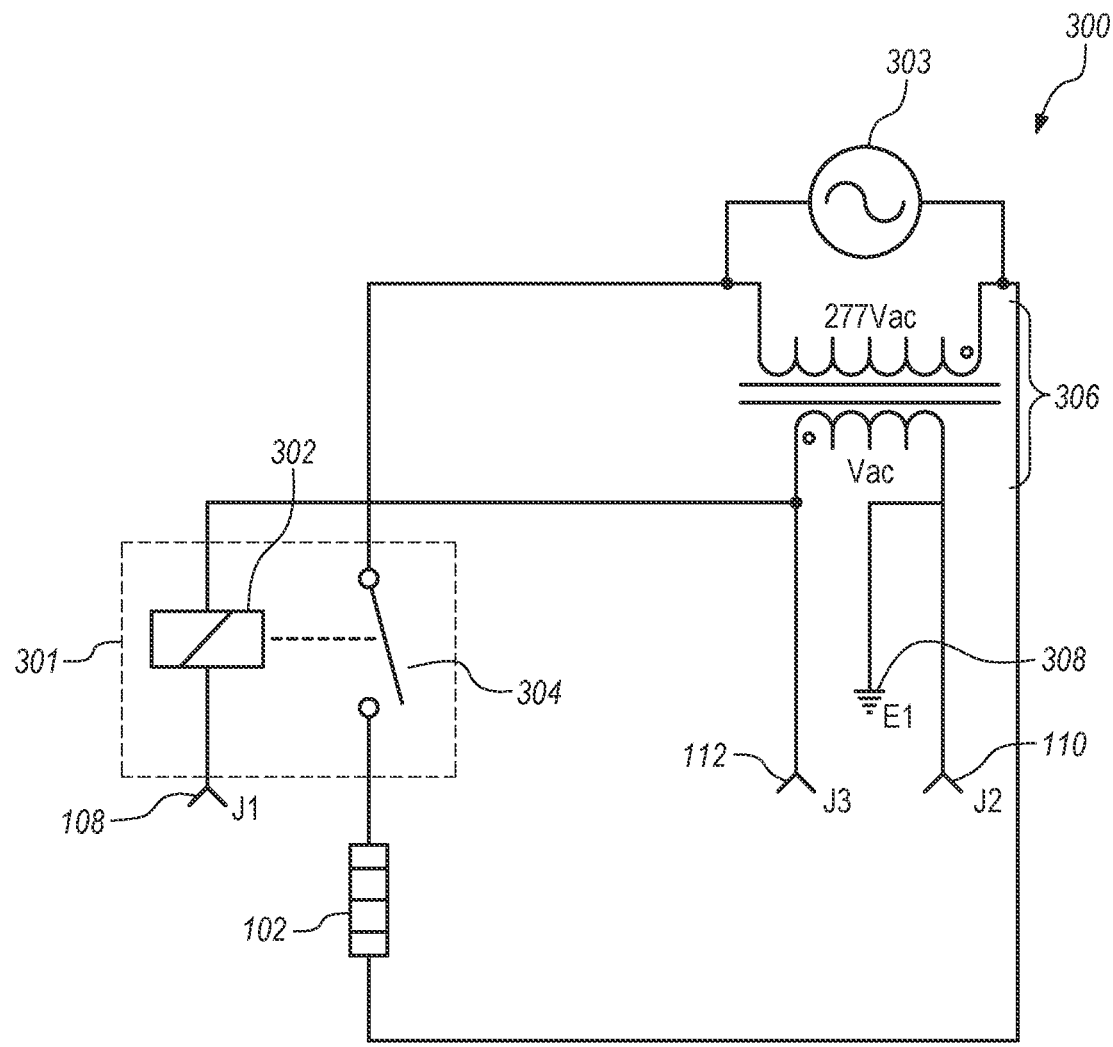
FIG. 3 illustrates an example embodiment of an EPAFS connected to the control circuitry of a forced air electric heating apparatus.

FIG. 3 shows the EPAFS interface within the HVACR equipment. Specifically, FIG. 3 shows an example embodiment of control circuit connections 300 for connecting EPAFS 106 to forced air electric heater 100. The control circuit is connected to AC power 303. In an example embodiment, the AC power 303 is 277 Volts AC line voltage, but a variety of different line voltages are possible. The control transformer 306 provides isolated AC voltage 112 to power low voltage control devices inside and connected to the HVACR equipment. The earth connection (E1) 308 improves electrical safety of the low voltage control circuits. Relay contact 304 closes to connect AC power 303 to the electric heating element 102. Relay contact 304 closes when relay coil 302 is energized by AC voltage 112, which occurs when switch 460 (FIG. 4) in the EPAFS 106 turns on, connecting the relay to neutral 110. In one embodiment switch 460 is a Triac or other solid-state switch. In another embodiment, switch 460 can be a relay or other electromechanical switch. Connections J1 108, J2 110 and J3 112 connect to the EPAFS 106. Connection J1 108 is the load 108 connection that energizes relay coil 302 when air flow is adequate. Connection J2 110 is the common, or neutral, connection. Connection J3 112 is AC voltage 112 connection to power the EPAFS 106.

Circuitry for EPAFS with Microcontroller and Potentiometer

FIG. 4 shows an example embodiment of circuit 400 for EPAFS 106 with a microcontroller 480 and a potentiometer 426. The DC power supply, which supplies DC voltage (VDC 490) is part of the EPAFS 106 but is not shown as these supplies are common knowledge to one of skill in the art and may be purchased or designed in many suitable forms. In one example embodiment, the DC power supply is a +5V power supply, which provides a VDC of +5V. Diode probe 116 comprises a first sensing diode 444 and second sensing diode 446 to sense air flow. Differential amplifier 455 comprises operational amplifier 450 and associated circuitry. Differential amplifier 455 measures the difference between the junction voltage of first sensing diode 444 and the junction voltage of second sending diode 446 and amplifies the voltage difference.

In an example embodiment, differential amplifier 455, amplifies the difference in the junction voltages by ten. One of skill in the art would understand that alternative implementations of differential amplifiers could be used in place of differential amplifier 455. Inverter-amplifier circuit 457 inverts the amplified difference signal and further amplifies the signal. In an example embodiment, inverter-amplifier circuit 457 amplifies the inverted signal by 20 to provide a total gain of 200. One of skill in the art would understand that alternative implementations of a difference circuit could be used in place of inverter-amplifier circuit 457.

Microcontroller 480 is used to compare the amplified signal to an adjustable threshold of suitable air flow set by a potentiometer 426. If the amplified signal is above the threshold, switch 460 is turned off. If the amplified signal is below threshold, switch 460 is turned on.

Diode D1 440 is a half wave rectifier providing current pulses, or heating pulses 200 to first sensing diode 444. Resistor R2 404 limits the peak and instantaneous current through first sensing diode 444. The pulsating direct current from the cathode 482 of diode D1 440 is monitored by microcontroller 480 via connection 478. Resistor R1 402 provides current limiting for Zener diode D2 442. Zener diode D2 442 limits the voltage to the microcontroller 480 input 478 to below the microcontroller supply voltage, which is VDC provided by the DC power supply.

Since a diode's junction voltage varies with the junction temperature, resistor R3 406 and resistor R4 408 provide sensing current to first sensing diode 444 and second sensing diode 446, respectively. The sensing current is small to minimize self-heating of the junction between first sensing diode 444 and second sensing diode 446, but the sensing current is high enough to allow measurement of the junction voltage of first sensing diode 444 and the junction voltage of second sensing diode 446.

Resistor R5 410, resistor R6 412, resistor R7 414, and resistor R8 416 work with operational amplifier 450 to form differential amplifier 455. The ratio of the resistance of resistor R7 414 divided by the resistance of resistor R5 410, and the ratio of the resistance of resistor R8 416 divided by the resistance of resistor R6 412 set the gain of inverting input 451 and non-inverting input 453 of differential amplifier 455. The inverting input 451 is connected to the first sensing diode 444 and the non-inverting input 453 is connected to the second sensing diode 446. The inverted input gain is the same as the noninverting input gain.

Inverter-amplifier circuit 457 comprises operational amplifier 452 and the associated circuitry. Inverter-amplifier circuit 457 provides additional gain, inverts the signal, and adjusts output 454 to the proper range for reading by the analog-to-digital converter (not shown) that is a part of microcontroller 480. One of skill in the art would understand that in an alternative embodiment an analog-to-digital converter could be connected to microcontroller 480 rather than part of microcontroller 480. The ratio of the resistance of resistor R12 424 divided by the resistance of resistor R9 418 sets the gain of operational amplifier 452. The output 454 of operational amplifier 450 produces a signal that increases when the junction temperature of first sensing diode 444 is hotter, or higher, than the temperature of the junction of second sensing diode 446.

Potentiometer 426 is connected to an input of the analog to digital converter that is a part of microcontroller 480.

Microcontroller 480 indirectly monitors heating pulses 200 using the signal provided by the connection from resistor R1 402 to microcontroller input 478. When signal at input 478 indicates heating pulses 200 have been off for a fixed time T, microcontroller 480 digitizes the signals from output 456 of operational amplifier 452 and threshold adjustment potentiometer 426 and then compares the two digitized signals. In one embodiment, fixed time T is 2 milliseconds. If the threshold set by potentiometer 426 is exceeded by the signal from the output 456 of operational amplifier 452, then microcontroller 480 turns off switch 460. If the threshold set by potentiometer 426 is greater than the output 456 of operational amplifier 452, then microcontroller 480 turns on switch 460.

FIG. 13 shows example values for circuit element and example parts for one embodiment of circuit 400 for EPAFS 106 with microcontroller 480 and potentiometer 426 as shown in FIG. 4. One of skill in the art will understand that other values for circuit element, other parts, and other combinations of circuit elements and parts can be used for circuit 400.

Alternative Circuitry Embodiments for EPAFS

Figure 5:
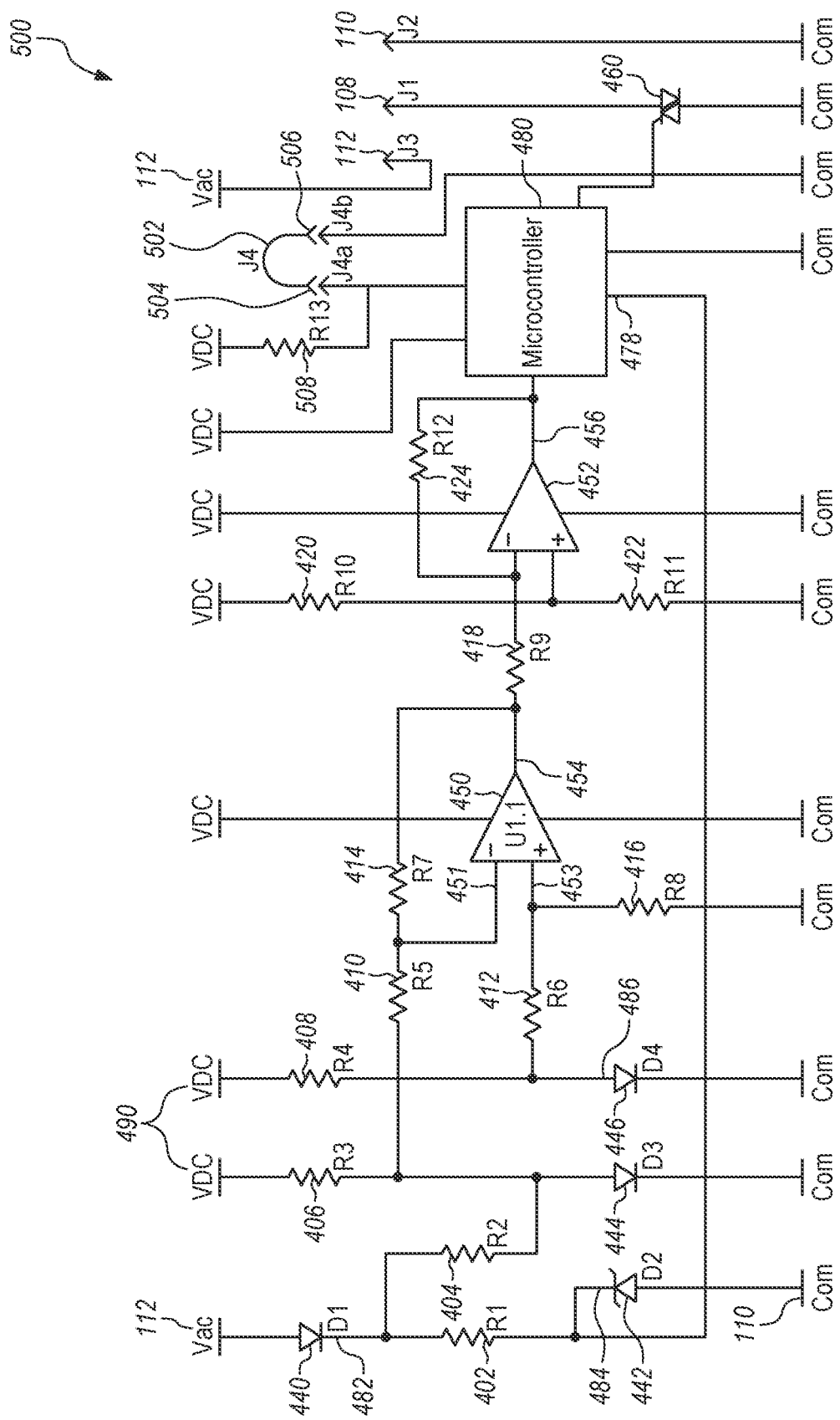
FIG. 5 shows an example embodiment of a circuit for an EPAFS air flow sensor with a microcontroller and a jumper.

FIG. 5 shows an example embodiment consisting of circuit 500 for EPAFS 106 that replaces the potentiometer 426 in circuit 400 in FIG. 4 with a pull up resistor 508 and jumper 502. In the example embodiment of circuit 500 shown in FIG. 5, adjustment is made by removing the jumper 502 at connection point J4a 504 and connection point J4b 506 when air flow is sufficient for electric heating element 102 operation. Microcontroller 480 stores the measured air flow value as the threshold where switch 460 is turned on but turns switch 460 off when the air flow drops below this stored air flow threshold.

FIG. 14 shows example values and example parts for one embodiment of circuit 500 for EPAFS 106 with a microcontroller 480 and a jumper 502 as shown in FIG. 5. One of skill in the art will understand that other values for circuit element, other parts, and other combinations of circuit elements and parts can be used in circuit 500.

Figure 6:
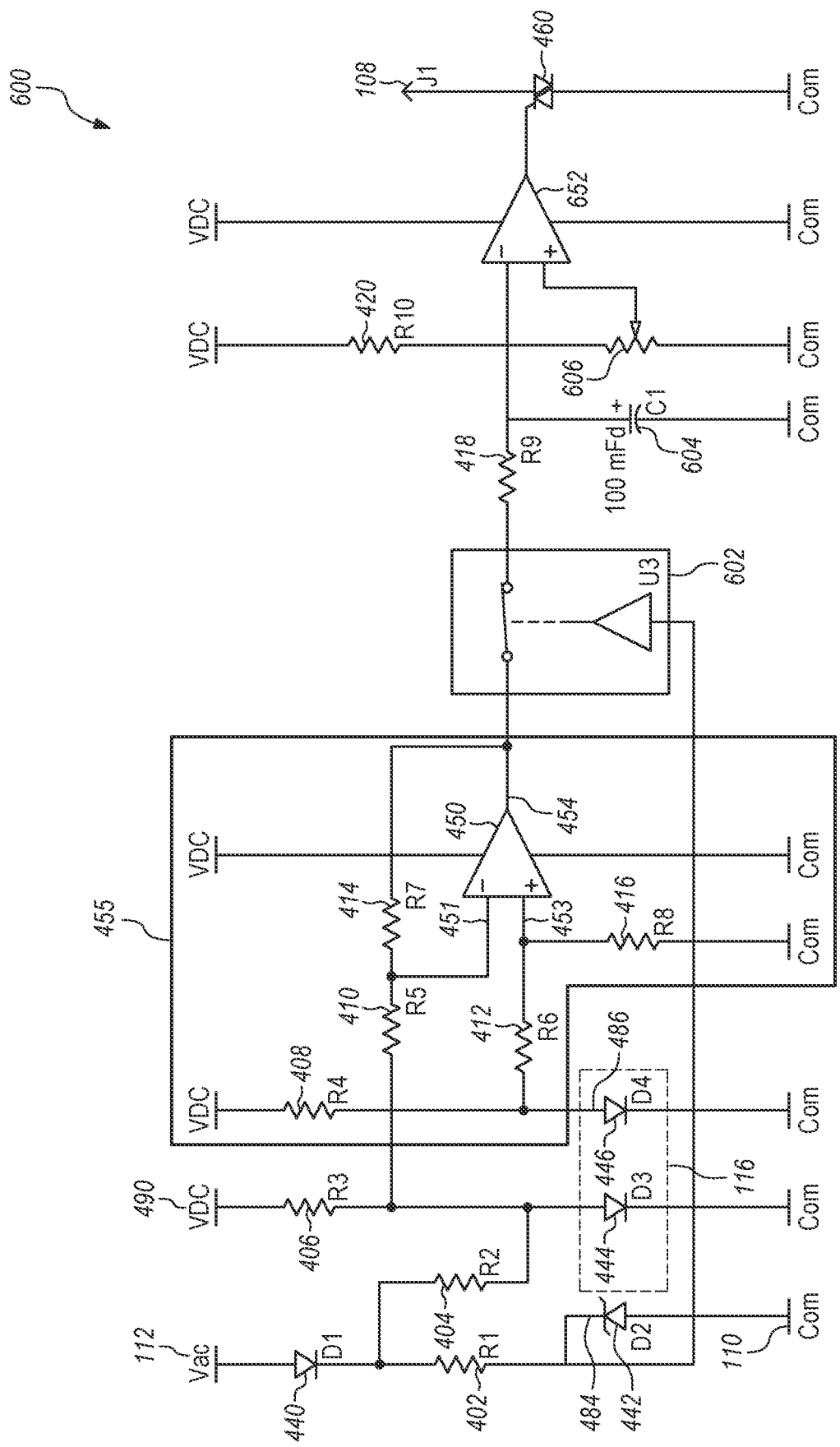
FIG. 6 is an example embodiment of an analog circuit for an analog EPAFS with a sample hold circuit and potentiometer adjustment.

FIG. 6 shows an example embodiment consisting of analog circuit 600 for EPAFS 106 where microcontroller 480 shown in circuit 400 in FIG. 4 is replaced by an analog sample and hold circuit 602 installed between operational amplifier 450 and analog comparator 652. The sample and hold circuit 602 is controlled by the pulses from the cathode 484 of diode D2 442 and used to turn off sampling when heating pulses 200 are present. Analog comparator 652 compares adjust potentiometer 606 position, or a fixed value, to the output of the sample and hold circuit 602 and turns switch 460 in FIG. 6 on or off, accordingly.

FIG. 15 shows example values and example parts for one embodiment of analog circuit 600 for EPAFS 106 with sample and hold circuit 602 and adjust potentiometer 606 as shown in FIG. 6. One of skill in the art will understand that other values for circuit element, other parts, and other combinations of circuit elements and parts can be used in analog circuit 600.

Figure 7:
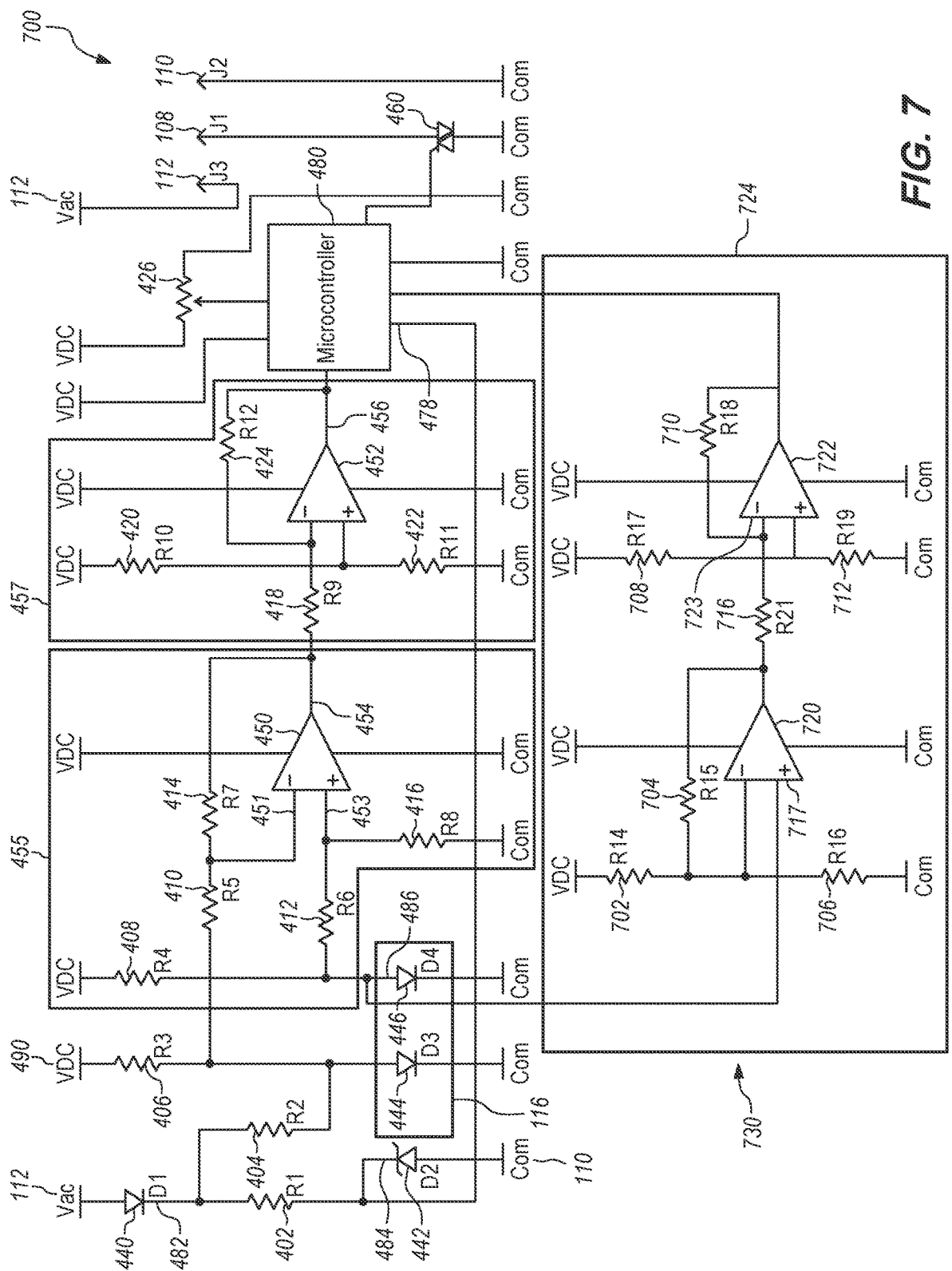
FIG. 7 is an example embodiment of an EPFAS with high temperature cutout circuitry.

FIG. 7 shows high temperature cutout circuit 700 comprising a two-stage amplifier 730 used high temperature cutout circuit that can be added to circuit 400 in FIG. 4 to amplify the voltage from the anode 486 of second sensing diode 446. Two-stage amplifier 730 comprises operational amplifier 720 and second stage operational amplifier 722. The ratio of the resistance of resistor 704 divided by the resistance value calculated by treating resistors 702 and 706 as if they were connected in parallel plus one sets the gain for the positive input 717 of operational amplifier 720 with VDC multiplied by the resistance of resistor 704 and divided by the resistance of resistor 702 added as an offset voltage. The ratio of the resistance of resistor 710 divided by the resistance of resistor 716 sets the gain of the negative input 723 of operational amplifier 722. The ratio of the resistance of resistor 708 divided by the resistance of resistor 712 times VDC determines the offset voltage of operational amplifier 722. In an example embodiment VDC is +5V. The output 724 of the two-stage amplifier 730 is an amplified signal that is connected to microcontroller 480 where it is used as a temperature indication. As an additional safety feature the microcontroller 480 turns switch 460 off when the temperature is above a temperature threshold and too high for safe operation of electric heating element 102. Two-stage amplifier 730 can also be used with circuit 500 shown in FIG. 5.

FIG. 16 shows example values and example parts for one embodiment of an EPFAS 106 with high temperature cutout circuit 700 shown in FIG. 7. One of skill in the art will understand that other values for circuit element, other parts, and other combinations of circuit elements and parts can be used.

Figure 8:
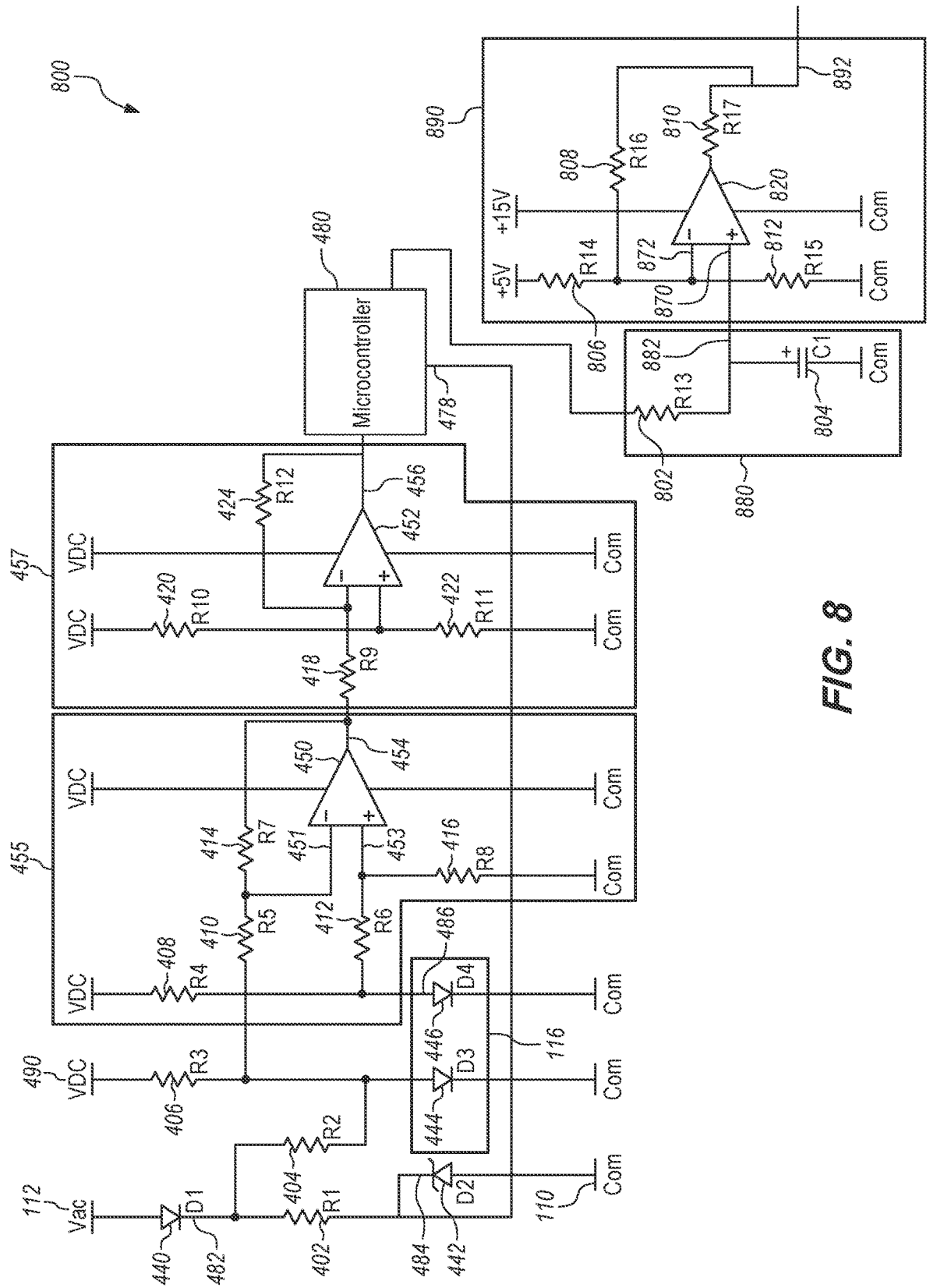
FIG. 8 shows an example embodiment of an EPFAS with a circuit for use as a thermal anemometer.

In another example embodiment, thermal anemometer circuit 800 in FIG. 8 uses input signal 456 to microcontroller 480 to output an analog control signal 892 representing air velocity. In one embodiment, this can be done with an instrument commonly known as a thermal anemometer. In another embodiment, the microcontroller conditions the input signal to provide an output signal that is linear with air flow velocity. The microcontroller 480 outputs an 80 Hz pulse-width-modulated signal to an integrator 880 comprising resistor R83 802 and capacitor C1 804. The result is a 0 to +5V analog output signal 882 at the output of integrator 880. Amplifier 890 comprising operational amplifier 820 and associated circuitry amplifies the analog output signal 882 producing an industry standard 0 to +10V analog control signal 892. The potentiometer adjustment 426 shown in FIG. 4 or the jumper adjust 502 shown in FIG. 5 can also be used in conjunction with the embodiment shown of thermal anemometer circuit 800 shown in FIG. 8. In another embodiment, the integrator circuitry 880 can be eliminated by using a microcontroller 480 with an internal digital-to-analog converter.

FIG. 17 shows example values and example parts for one embodiment of thermal anemometer circuit 800 for use as an EPFAS 106 shown in FIG. 8. One of skill in the art will understand that other values for circuit element, other parts, and other combinations of circuit elements and parts can be used.

Remote Air Flow Sensor

Figure 9A:
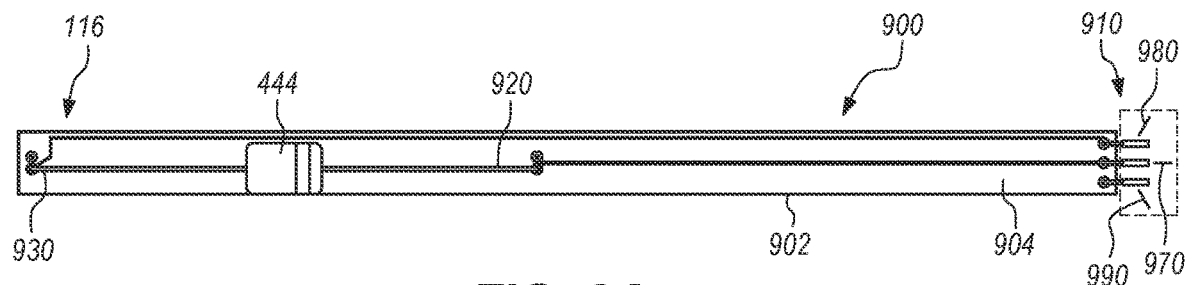
FIGS. 9A-C show an example embodiment of a circuit for an EPAFS single point remote air flow probe.
Figure 9B:
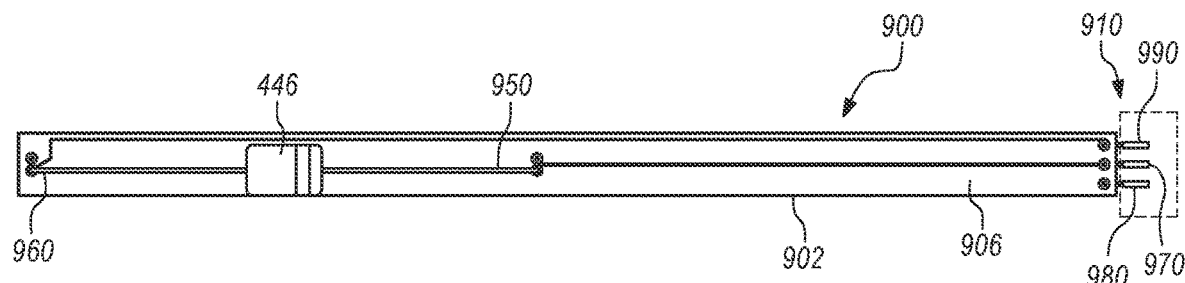
Figure 9C:
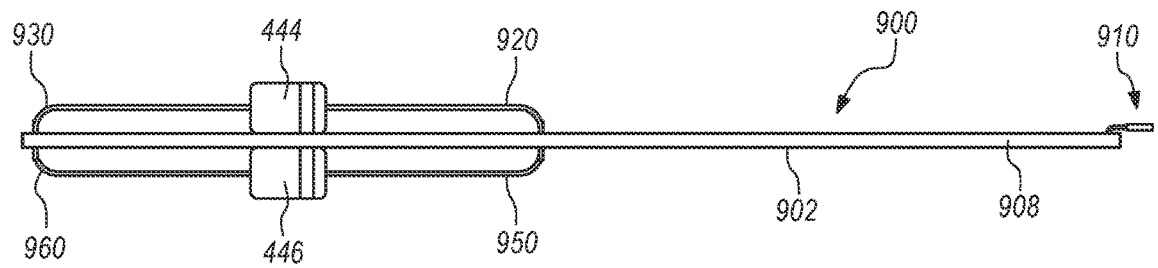

FIGS. 9A-9C show three views of single point remote air flow sensor 900, which is one example embodiment of diode probe 116 used with EPAFS 106. First sensing diode 444 and second sensing diode 446 are mounted on single point remote air flow sensor 900, then connected to the EPAFS 106 by three electrical conductors 970, 980, and 990. The single point remote air flow sensor 900 is constructed from a two-sided printed circuit board 902 with top side 904 with first sensing diode 444 as shown in FIG. 9A, and bottom side 906 with second sensing diode 446 as shown in FIG. 9B. Cathodes 920 and 950 are connected to electrical conductor 970, anode 930 is connected to conductor 980, and anode 960 is connected to conductor 990. The single-point remote air flow sensor is mounted so air flow is across the edge 908 of the printed circuit board 902 as shown in FIG. 9C.

FIGS. 10A-10C shows three views of a multi-point remote air flow sensor 1000, which can be used in place of diode probe 116 for use with the EPAFS 106 in each of the disclosed embodiments. Multi-point remote air flow sensor 1000 is connected to the EPAFS 106 by three electrical conductors 1070, 1080, and 1090. The multi-point remote air flow sensor 1000 is constructed from a 2-sided printed circuit board 1002 with top side 1004 fitted with first diode string 1010 comprising three series connected sensing diodes 1012, 1014 and 1016 as shown in FIG. 10A, and bottom side 1006 fitted with second diode string 1040 comprising three series connected sensing diodes 1042, 1044 and 1046 as shown in FIG. 10B. Sensing diodes 1012 and 1042 form one diode pair, sensing diodes 1014 and 1044 form a second diode pair, and sensing diodes 1016 and 1046 form a third diode pair. The diode pairs may be placed near each other on the printed circuit board or the diode pairs may be spaced apart on the printed circuit board.

A three-point sensing probe 1000 can be used to replace first sensing diode 444 with first diode string 1010 where sensing diodes 1012, 1014, and 1016 are wired in series, and second sensing diode 446 with second diode string 1040 where sensing diodes 1042, 1044, and 1046 are wired in series. As shown in FIGS. 10C and 10D, series connected sensing diodes 1012 and 1042 form a first sensing diode pair 1050, series connected sensing diodes 1014 and 1044 form a second sensing diode pair 1060, and series connected sensing diodes 1016 and 1046 form a third sensing diode pair 1070. However, in alternative embodiments, more or fewer series connected sensing diode pairs can be used.

The sensing diode pairs 1050, 1060, and 1070 are placed at different points in the heater duct 104 by spacing them apart on the printed circuit board to sense average air flow. As shown in FIG. 10A-D, the cathode ends 1019 and 1049 connect to conductor 1070. Anode 1018 is connected to conductor 1080 and anode 1048 is connected to conductor 1090. The multi-point remote air flow sensor 1000 is mounted so air flow is across the edge of the printed circuit board 1009 as shown in FIG. 10C. While three pairs of sensing diodes are shown, more or fewer sensor pairs may be used.

Frost Detection System

Figure 11:
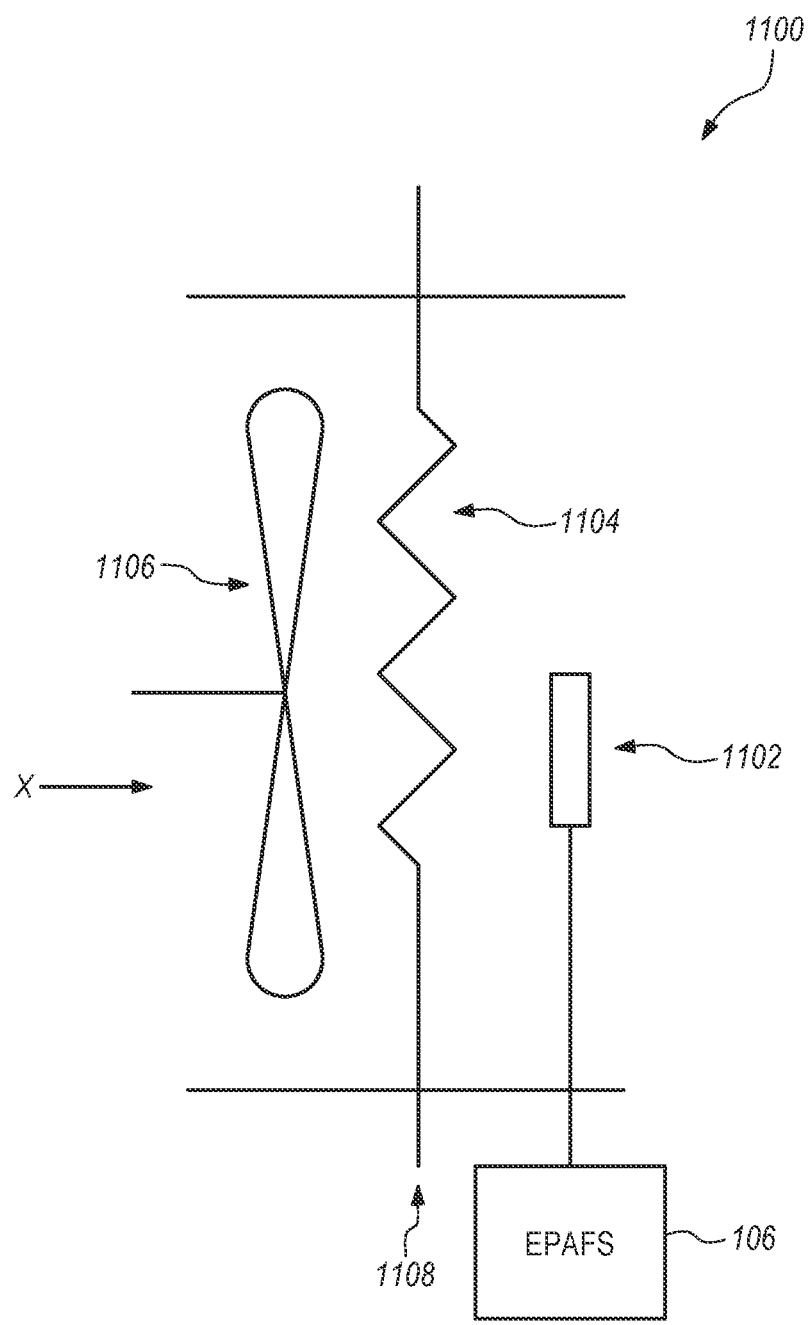
FIG. 11 is an example embodiment of evaporator frost detection remote sensor system for an EPAFS.

FIG. 11 shows a frost detection system 1100 comprising an evaporation frost detection remote air flow probe 1102 mounted in the air flow leaving a refrigeration evaporator 1104. Evaporation frost detection remote air flow probe 1102 is connected to an EPAFS 106, such as those shown in FIGS. 4-8. Single point remote air flow sensor 900 or multi-point remote air flow sensor 1000 may be used as the evaporation frost detection remote air flow probe 1102. Fan 1106 may be used to direct airflow through evaporator 1104. Evaporators, such as evaporator 1104, for refrigeration are often used where frost accumulates on heat exchange fins, which blocks air flow. Airflow through the evaporator 1104 is restricted when frost forms on evaporator 1104. When the air flow is too low, the EPAFS 106 turns off switch 460 signaling the refrigeration equipment to start the defrost cycle.

Remote Air Flow Sensor and System

Figure 12:
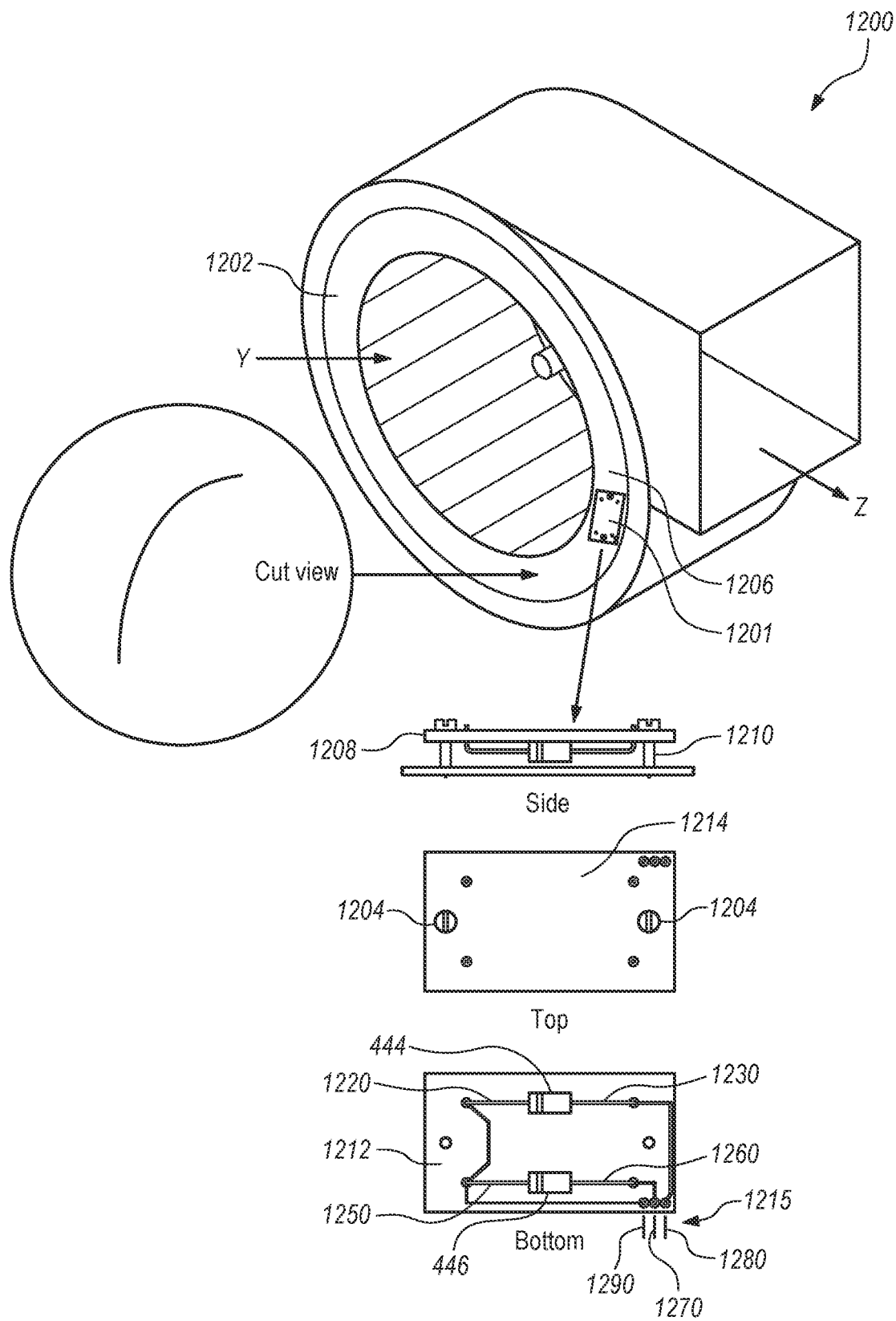
FIG. 12 is an example embodiment of a fan inlet cone remote sensor system for an EPAFS.

FIG. 12 shows system 1200 for a fan inlet cone 1202 comprising a remote air flow sensor 1201 designed to mount on the surface 1206 of fan inlet cone 1202 for use with an EPAFS 106, such as those shown in FIGS. 4-8. Air flowing in the Y direction across the surface 1206 of a fan inlet cone 1202 is an excellent representation of total fan air volume, so mounting remote air flow sensor 1201 to measure air flow at the surface 1206 of the inlet cone 1202 is desirable. Air flow exits the fan inlet cone 1202 in the direction Z. A printed circuit board 1208 with two screws 1204 and standoffs 1210 to mount the board 1208 is an example of a sensor 1201. Printed circuit board 1208 has a bottom side 1212 and a top side 1214. Printed circuit board 1208 is mounted to fan inlet cone 1202 using standoffs 1210 to allow air flow between the bottom side 1212 of the printed circuit board and the fan inlet cone.

The bottom side 1212 of the printed circuit board 1208 is fitted with first sensing diode 444 and second sensing diode 446, then wired by a three-conductor electrical cable 1215 to the EPAFS 106. Three-conductor electrical cable 1215 comprises conductor 1270, 1280, and 1290. The cathode 1220 of first sensing diode 444 is connected to conductor 1270 and the anode 1230 of first sensing diode 444 is connected to conductor 1280. The cathode 1250 of second sensing diode 446 is connected to conductor 1270 and the anode 1260 of second sensing diode 446 is connected to conductor 1290. The first sensing diode 444 and the second sensing diode 446 measure air flow between the bottom side 1212 of the printed circuit board 1208 and the fan inlet cone 1202.

Critical applications such as fan powered High Efficiency Particulate Air (HEPA) filters often need a mechanism such as shown in FIG. 12 to indicate proper operation. The EPAFS 106 and remote air flow sensor 1201 provides such a mechanism.

What is claimed is:

1. An EPAFS and probe apparatus for use in an HVACR system comprising:
   a diode probe comprising:
      a first sensing diode with a first junction voltage; and
         a second sensing diode with a second junction voltage;
   a half wave rectifier, wherein the half wave rectifier provides a heating pulse to heat the first sensing diode during a heating period and no heating pulse during a measuring period;
   a differential amplifier, wherein the differential amplifier measures a difference between the first junction voltage of the first sensing diode and the second junction voltage of the second sensing diode during the measuring period, and outputs a first output signal based on the difference between the first junction voltage and the second junction voltage;
   an inverter-amplifier circuit, wherein the inverter-amplifier circuit amplifies the first output signal from the differential amplifier and outputs a second output signal;
   a microcontroller, wherein the microcontroller compares the second output signal from the inverter-amplifier circuit to a threshold value;
   a switch for connecting to a forced air electric heating apparatus; and
   wherein the microcontroller is connected to the switch, and wherein the microcontroller turns off the switch when the second output signal exceeds the threshold value.

2. The EPAFS and probe apparatus of claim 1 further comprising a potentiometer for setting the threshold.

3. The EPAFS and probe apparatus of claim 1 wherein the switch is a solid-state switch.

4. The EPAFS and probe apparatus of claim 1 wherein the half wave rectifier comprises a diode.

5. The EPAFS and probe apparatus of claim 1 wherein the microcontroller further comprises an analog-to-digital converter.

6. The EPAFS and probe apparatus of claim 1 further comprising:
   a pull up resistor;
   a jumper; and
   wherein the pull up resistor and jumper set the threshold.

7. The EPAFS and probe apparatus of claim 1 further comprising:
   the second sensing diode further comprising an anode;
   a two-stage amplifier having an input connected to the anode of the second sensing diode and an output connected to the microcontroller;
   wherein the output of the two-stage amplifier is an amplified signal indicative of air temperature;
   and wherein the microcontroller turns off the switch when the output of the two-stage amplifier is above a temperature threshold value.

8. The EPAFS and probe apparatus of claim 1 further comprising:
   an integrator connected to an output of the microcontroller;
   an amplifier connected to the output of the integrator; and
   wherein the output of the amplifier is indicative of air flow velocity.

9. The EPAFS and probe apparatus of claim 1 wherein the diode probe further comprises:
   a printed circuit board;
   a first conductor;
   a second conductor;
   a third conductor;
   the first sensing diode mounted the printed circuit board, the first sensing diode comprising:
      a first cathode connected to the first conductor; and
      a first anode connected to the second conductor; and
   the second sensing diode mounted on the printed circuit board, the second sensing diode comprising:
      a second cathode connected to the first conductor; and
      a second anode connected to the third conductor.

10. An EPAFS and probe apparatus for use in an HVACR system comprising:
    a diode probe comprising:
       a first sensing diode with a first junction voltage; and
          a second sensing diode with a second junction voltage;
    a half wave rectifier, wherein the half wave rectifier provides a heating pulse to heat the first sensing diode during a heating period and no heating pulse during a measuring period;
    a differential amplifier, wherein the differential amplifier measures a difference between the first junction voltage of the first sensing diode and the second junction voltage of the second sensing diode during the measuring period, and outputs a signal based on the difference between the first junction voltage and the second junction voltage;
    a sample and hold circuit, wherein the sample and hold circuit monitors the heating period and the measuring period to capture the signal during the measuring period and outputs a captured signal;
    a comparator, wherein the comparator compares the captured signal from the sample and hold circuit to a threshold value;
    a switch for connecting to a forced air electric heating apparatus; and
    wherein the comparator is connected to the switch, and wherein the comparator turns off the switch when the captured signal from the sample and hold circuit exceeds the threshold value.

11. The EPAFS and probe apparatus of claim 10 further comprising a potentiometer for setting the threshold.

12. An EPAFS and probe apparatus for use in an HVACR system comprising:

a diode probe comprising:
  a first sensing diode string with a first series junction voltage comprising:
    a plurality of first sensing diodes; and
    wherein the plurality of first sensing diodes are connected in series;
  second sensing diode string with a second series junction voltage comprising:
    a plurality of second sensing diodes; and
    wherein the plurality of second sensing diodes are connected in series; and
  wherein each one of the plurality of first sensing diodes forms a sensing diode pair with one of the plurality of second sensing diodes to form a plurality of sensing diode pairs; and
  wherein the plurality of sensing diode pairs sense the average air flow;
a half wave rectifier, wherein the half wave rectifier provides a heating pulse to heat the first sensing diode string during a heating period and no heating pulse during a measuring period;
a differential amplifier, wherein the differential amplifier measures a difference between the first series junction voltage of the first sensing diode string and the second series junction voltage of the second sensing diode string during the measuring period, and outputs a first output signal based on the difference between the first series junction voltage and the second series junction voltage;
an inverter-amplifier circuit, wherein the inverter-amplifier circuit amplifies the first output signal from the differential amplifier and outputs a second output signal;
a microcontroller, wherein the microcontroller compares the second output signal from the inverter-amplifier circuit to a threshold value;
a switch for connecting to a forced air electric heating apparatus; and
wherein the microcontroller is connected to the switch, and wherein the microcontroller turns off the switch when the second output signal exceeds the threshold value.

13. The EPAFS and probe apparatus of claim 12 further comprising a potentiometer for setting the threshold.

14. The EPAFS and probe apparatus of claim 13 further comprising:
  a pull up resistor;
  a jumper; and
  wherein the pull up resistor and jumper set the threshold.

15. The EPAFS and probe apparatus of claim 13 further comprising:
  an integrator connected to an output of the microcontroller;
  an amplifier connected to the output of the integrator; and
  wherein the output of the amplifier is indicative of air flow velocity.

16. The EPAFS and probe apparatus of claim 1 wherein the microcontroller further comprises an analog-to-digital converter.

17. An EPAFS and probe apparatus for use in an HVACR system comprising:
  a diode probe comprising:
    a first sensing diode string with a first series junction voltage comprising:
      a plurality of first sensing diodes; and
      wherein the plurality of first sensing diodes are connected in series;
    second sensing diode string with a second series junction voltage comprising:
      a plurality of second sensing diodes; and
      wherein the plurality of second sensing diodes are connected in series; and
    wherein each one of the plurality of first sensing diodes forms a sensing diode pair with one of the plurality of second sensing diodes to form a plurality of sensing diode pairs; and
    wherein the plurality of sensing diode pairs sense the average air flow;
  a half wave rectifier, wherein the half wave rectifier provides a heating pulse to heat the first sensing diode string during a heating period and no heating pulse during a measuring period;
  a differential amplifier, wherein the differential amplifier measures a difference between the first series junction voltage of the first sensing diode string and the second series junction voltage of the second sensing diode string during the measuring period, and outputs a first output signal based on the difference between the first series junction voltage and the second series junction voltage;
  a sample and hold circuit, wherein the sample and hold circuit monitors the heating period and the measuring period to capture the signal during the measuring period and outputs a captured signal;
  a comparator, wherein the comparator compares the captured signal from the sample and hold circuit to a threshold value;
  a switch for connecting to a forced air electric heating apparatus; and
  wherein the comparator is connected to the switch, and wherein the comparator turns off the switch when the second output signal exceeds the threshold value.

18. The EPAFS and probe apparatus of claim 17 further comprising a potentiometer for setting the threshold.

19. A remote air flow sensor for a fan inlet cone comprising:
  a printed circuit board, the printed circuit board comprising:
    a top side;
    a bottom side;
    a first conductor;
    a second conductor; and
    a third conductor;
  a first sensing diode mounted to the bottom side of the printed circuit board, the first sensing diode comprising:
    a first cathode connected to the first conductor; and
    a first anode connected to the second conductor;
  a second sensing diode mounted on the bottom side of the printed circuit board, the second sensing diode comprising:
    a second cathode connected to the first conductor; and
    a second anode connected to the third conductor;
  a plurality of standoffs for mounting the printed circuit board to a fan inlet cone for allowing air flow between the bottom side of the printed circuit board and the fan inlet cone; and
  wherein the first sensing diode and second sensing diode measure air flow between the bottom side of the printed circuit board and the fan inlet cone.

20. An EPAFS and probe apparatus for use in an HVACR system comprising:
- a diode probe comprising:
    - a first sensing diode with a first junction voltage;
    - a second sensing diode with a second junction voltage; and
    - wherein the diode probe measures air flow leaving a refrigeration evaporator;
- a half wave rectifier, wherein the half wave rectifier provides a heating pulse to heat the first sensing diode during a heating period and no heating pulse during a measuring period;
- a differential amplifier, wherein the differential amplifier measures a difference between the first junction voltage of the first sensing diode and the second junction voltage of the second sensing diode during the measuring period, and outputs a first output signal based on the difference between the first junction voltage and the second junction voltage;
- an inverter-amplifier circuit, wherein the inverter-amplifier circuit amplifies the first output signal from the differential amplifier and outputs a second output signal;
- a microcontroller, wherein the microcontroller compares the second output signal from the inverter-amplifier circuit to a threshold value;
- a switch for connecting to a refrigeration equipment for controlling a defroster; and
- wherein the microcontroller is connected to the switch, and wherein the microcontroller turns off the switch when the second output signal exceeds the threshold value.

* * * * *